(12) United States Patent
Ishida

(10) Patent No.: US 6,313,832 B1
(45) Date of Patent: *Nov. 6, 2001

(54) REMAINING BATTERY CAPACITY DISPLAY DEVICE

(75) Inventor: Makoto Ishida, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/143,192

(22) Filed: Aug. 31, 1998

(30) Foreign Application Priority Data

Mar. 10, 1998  (JP) .................................. 10-057757

(51) Int. Cl.$^7$ ........................................................ G09G 5/00
(52) U.S. Cl. .......................................... 345/211; 713/320
(58) Field of Search ................................. 345/211, 212; 713/320, 321, 324, 340

(56) References Cited

U.S. PATENT DOCUMENTS

| | | | |
|---|---|---|---|
| 4,626,765 | * 12/1986 | Tanaka | 320/48 |
| 5,349,535 | * 9/1994 | Gupta | 364/550 |
| 5,684,404 | * 11/1997 | Millar | 324/426 |
| 5,867,140 | * 2/1999 | Rader | 345/98 |
| 5,917,777 | * 6/1999 | Tanigawa | 345/211 |
| 5,994,877 | * 11/1999 | Seri et al. | 320/132 |
| 6,005,559 | * 12/1999 | Miyamoto | 345/212 |

\* cited by examiner

*Primary Examiner*—Richard Hjerpe
*Assistant Examiner*—Ronald Laneau
(74) *Attorney, Agent, or Firm*—Helfgott & Karas, P.C.

(57) ABSTRACT

There is provided a remaining battery capacity display device for use in a communication device powered by a battery, which is capable of displaying an exact remaining battery capacity even if battery current consumption varies. A voltage detection device detects a value of voltage of the battery to deliver the detected voltage value to a remaining battery capacity calculation device within a controller, while a current consumption calculation device calculates a battery current consumption based on a transmission output level of a transmission/reception block to deliver the calculated battery current consumption to the remaining battery capacity calculation device. The remaining battery capacity calculation device calculates a remaining battery capacity based on the received values of the battery voltage and battery current consumption. Functions employed by the current consumption calculation device and the remaining battery capacity calculation device for respective calculating operations are prepared in advance based on measurement data. A display control device causes a display device to carry out display operation based on the remaining battery capacity calculated by the remaining battery capacity calculation device.

6 Claims, 11 Drawing Sheets

|  | | BATTERY VOLTAGE RANGES | | | |
|---|---|---|---|---|---|
| | | lower than $V_{TH1}$ | equal to or higher than $V_{TH1}$ and lower than $V_{TH2}$ | equal to or higher than $V_{TH2}$ and lower than $V_{TH3}$ | equal to or higher than $V_{TH3}$ and lower than $V_{TH4}$ | equal to or higher than $V_{TH4}$ |
| APC SETTING VALUE | $P_{TH1}$ | 0 | 0 | 1 | 2 | 3 |
| | $P_{TH2}$ | 0 | 1 | 2 | 2 | 3 |
| | $P_{TH3}$ | 0 | 1 | 2 | 3 | 3 |

INDEX VALUE T2

0: within 1 minute

1: 1 to 10 minutes

2: 10 to 40 minutes

3: over 40 minutes

FIG. 6

| BATTERY CURRENT CONSUMPTION RANGES | BATTERY VOLTAGE RANGES | | | | |
|---|---|---|---|---|---|
| | lower than $V_{TH1}$ | equal to or higher than $V_{TH1}$ and lower than $V_{TH2}$ | equal to or higher than $V_{TH2}$ and lower than $V_{TH3}$ | equal to or higher than $V_{TH3}$ and lower than $V_{TH4}$ | equal to or higher than $V_{TH4}$ |
| smaller than $I_{TH1}$ | P2 1 | P2 2 | P2 3 | P2 4 | P2 5 |
| equal to or larger than $I_{TH1}$ and smaller than $I_{TH2}$ | P2 6 | P2 7 | P2 8 | P2 9 | P2 10 |
| equal to or larger than $I_{TH2}$ and smaller than $I_{TH3}$ | P2 11 | P2 12 | P2 13 | P2 14 | P2 15 |
| equal to or larger than $I_{TH3}$ and smaller than $I_{TH4}$ | P2 16 | P2 17 | P2 18 | P2 19 | P2 20 |
| equal to or larger than $I_{TH4}$ | P2 21 | P2 22 | P2 23 | P2 24 | P2 25 |

FIG. 8

REMAINING BATTERY CAPACITY DISPLAY DEVICE

BACKGROUND OF THE INVENTION

1. Field of the Invention

The present invention relates to a remaining battery capacity display device for use in a communication device powered by a battery, and more particularly, to a remaining battery capacity display device suitable for a mobile terminal employed in a CDMA (Code Division Multiple Access)-based mobile communications network.

2. Description of the Related Art

In general, it is a matter of great concern to an operator of an apparatus powered by a battery to be informed of remaining time available for operation of the apparatus. The present invention is concerned with display of such remaining time or remaining capacity of the battery.

Conventionally, the voltage value of the battery is used in estimating remaining operating time available for operation of apparatuses of the above-mentioned type. FIG. 11 shows an example of curves representative of current-voltage characteristics of a lithium battery exhibited at respective levels of the remaining capacity of the battery. As shown in FIG. 11, if the current consumption of the battery is constant, one-to-one correspondence holds between the voltage value of the battery and the remaining battery capacity. Therefore, it is possible to measure the battery voltage and then calculate the remaining battery capacity based on the measured value of the battery voltage. Further, since the current consumption is constant, it is possible to estimate remaining operating time of the device.

However, in the case of a mobile terminal powered by a battery, the passage of battery current through a transmitter, which consumes electric current more than any other component thereof, is permitted only during signal transmission, but is inhibited during standby for signal reception so as to prevent waste of remaining capacity of the battery. As a result, the battery current consumption during standby for signal reception is different from that during transmission. For that reason, in the mobile terminal, it is impossible to estimate remaining battery capacity or remaining operating time simply from a measured value of the battery voltage. Therefore, the mobile terminal employs two different methods of estimating remaining battery capacity, i.e. one used during standby for signal reception and the other used during signal transmission. For instance, the remaining battery capacity or remaining operating time is estimated such that the estimated value is smaller during signal transmission than during standby for signal reception.

In a CDMA-based mobile communications network, it is essentially required that signals transmitted from respective mobile terminals are received at the lowest possible level at each base station thereof. To this end, the base station always sends each mobile terminal a signal based on which the mobile terminal should adjust the level of a signal transmitted therefrom. Alternatively, a mobile terminal measures a reception level of a signal received from the base station, estimates an appropriate transmission level from the measured reception level, and then sends a signal to the base station at the estimated appropriate level. Therefore, the signal transmission level of the CDMA-based mobile terminal frequently changes as the terminal moves to change its position.

For the above reason, the battery current consumption by the CDMA-based mobile terminal is not constant even during transmission. Moreover, the transmission level of a signal from the terminal is required to be adjustable e.g. within a range of 20 dB to 70 dB. Therefore, the remaining battery capacity display device used in the conventional mobile terminal described above, which operates on the precondition that the battery current consumption is held constant during transmission, is not capable of displaying an exact remaining battery capacity for the CMDA-based mobile terminal.

SUMMARY OF THE INVENTION

It is an object of the invention to provide a remaining battery capacity display device which is capable of displaying an exact remaining battery capacity even if battery current consumption varies.

To attain the above object, according to a first aspect of the present invention, there is provided a remaining battery capacity display device for use in a communication device powered by a battery. The remaining battery capacity display device according to the first aspect of the invention is characterized by comprising voltage detection means for detecting a value of voltage of the battery, current consumption calculation means for calculating a battery current consumption corresponding to a transmission output level of the communication device, remaining battery capacity calculation means for calculating a remaining battery capacity based on the value of the voltage of the battery detected by the voltage detection means and the battery current consumption calculated by the current consumption calculation means, a display device, and display control means for causing the display device to carry out display operation according to the remaining battery capacity calculated by the remaining battery capacity calculation means.

Further, to attain the above object, according to a second aspect of the invention, there is provided a remaining battery capacity display device for use in a communication device powered by a battery. The remaining battery capacity display device according to the second aspect of the invention is characterized by comprising a predetermined table that stores data of communicatable time periods over which the communication device is capable of communication, the communicatable time periods being correlated to values of voltage of the battery and transmission output levels of the communication device, respectively, voltage detection means for detecting a value of the voltage of the battery of the communication device, reading means for reading out one of the communicatable time periods corresponding to the value of the battery voltage detected by the voltage detection means and one of the transmission output levels of the communication device, with reference to the predetermined table, and display means for displaying the one of the communicatable time periods read out by the reading means.

Further, to attain the above object, according to a third aspect of the invention, there is provided a remaining battery capacity display device for use in a communication device powered by a battery. The remaining battery capacity display device according to the third aspect of the invention is characterized by comprising voltage detection means for detecting a value of voltage of the battery of the communication device, current consumption calculation means for calculating a battery current consumption corresponding to transmission output of the communication device, a predetermined table that stores data of values of remaining battery capacity of the battery, the values of the remaining battery capacity being correlated to values of the voltage of the battery of the communication device, respectively, reading means for reading out one of the values of the remaining battery capacity corresponding to the value of the battery voltage detected by the voltage detection means, with reference to the predetermined table, a display device, and display control means for causing the display device to carry out display operation based on the one of the values of the remaining battery capacity read out by the reading means.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 6 shows a predetermined table which is used in the second embodiment;

FIG. 8 shows a predetermined table which is used in the third embodiment;

DESCRIPTION OF THE PREFERRED EMBODIMENTS

Preferred embodiments of the present invention will be described below with reference to accompanying drawings.

Figure 1:
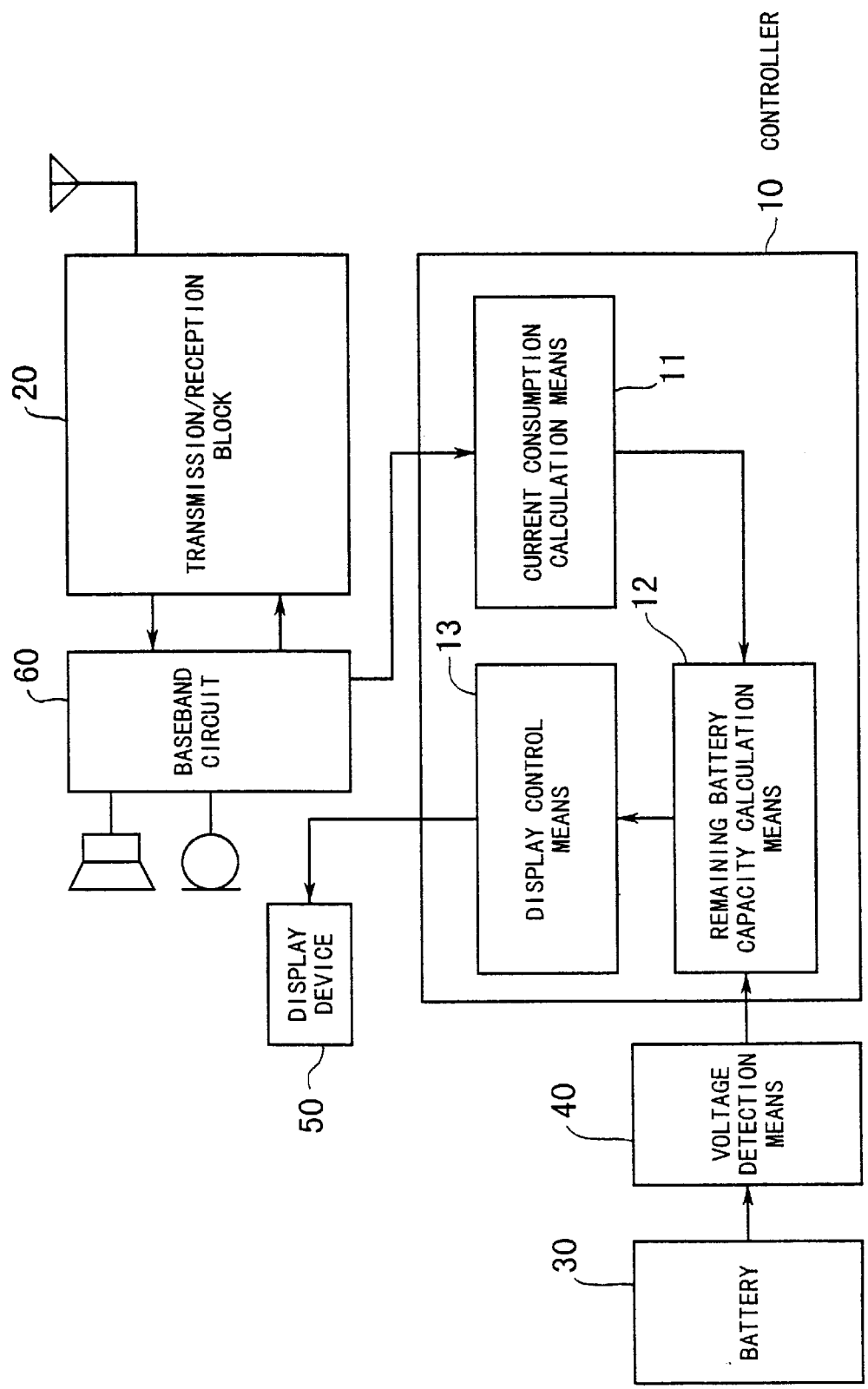
FIG. 1 is a block diagram useful in explaining the principles of the present invention.

Referring first to FIG. 1, description is made of the principles and construction of a remaining battery capacity display device for use in a communication device, according to a first embodiment of the invention. The display device is comprised of voltage detection means 40 for detecting a value of voltage of a battery 30, current consumption calculation means 11 for calculating a battery current consumption corresponding to a transmission output level of a transmission/reception block 20, remaining battery capacity calculation means 12 for calculating a remaining battery capacity based on the voltage value detected by the voltage detection means 40 and the battery current consumption calculated by the current consumption calculation means 11, and display control means 13 for causing a display device 50 to carry out display operation according to the remaining battery capacity calculated by the remaining battery capacity calculation means 12.

Further, the display control means 13 includes communicatable time period calculation means for calculating the maximum time period over which the communication device is capable of communication, based on the remaining battery capacity calculated by the remaining battery capacity calculation means 12 and the battery current consumption calculated by the current consumption calculation means 11, and communicatable time period display-instructing means for instructing the display device 50 to display the communicatable time period calculated by the communicatable time period calculation means.

In the above construction, the voltage detection means 40 detects a voltage of the battery 30 and then delivers the detected voltage value to the remaining battery capacity calculation means 12 within a controller 10. On the other hand, the current consumption calculation means 11 calculates a battery current consumption based on the transmission output level of the transmission/reception block 20, and then delivers the calculated battery current consumption to the remaining battery capacity calculation means 12. The remaining battery capacity calculation means 12 calculates a remaining battery capacity based on the detected value of the battery voltage and the calculated battery current consumption received from the respective means 40 and 11. Functions used by the current consumption calculation means 11 and the remaining battery capacity calculation means 12 for the respective calculating operations are prepared in advance based on measurement data.

The display control means 13 causes the display device 50 to carry out display operation according to the remaining battery capacity calculated by the remaining battery capacity calculation means 12.

Although the display device 50 may be designed to display the remaining battery capacity as it is, it is also possible to provide the display control means 13 with the communicatable time period calculation means and the communicatable time period display-instructing means so as to cause the display device 50 to display a communicatable time period. More specifically, first, the communicatable time period calculation means calculates the maximum time period over which the communication device is capable of communication, based on the remaining battery capacity calculated by the remaining battery capacity calculation means 12 and the battery current consumption calculated by the current consumption calculation means 11, and then the communicatable time period display-instructing means causes the display device 50 to display the communicatable time period calculated by the communicatable time period calculation means.

As described above, according to the present invention, the current consumption calculation means 11 calculates a battery current consumption based on a transmission output level of the transmission/reception block 20, while the remaining battery capacity calculation means 12 calculates a remaining battery capacity based on the calculated battery current consumption and the detected value of the battery voltage. Therefore, even if the transmission output level varies to vary the battery current consumption, it is possible to display an exact remaining battery capacity.

Further, the present invention makes it possible to display not only the remaining battery capacity but also the maximum communicatable time period which is calculated by the communicatable time period calculation means in a manner following up variation in the battery current consumption.

Next, the first embodiment will be described in detail.

Figure 2:
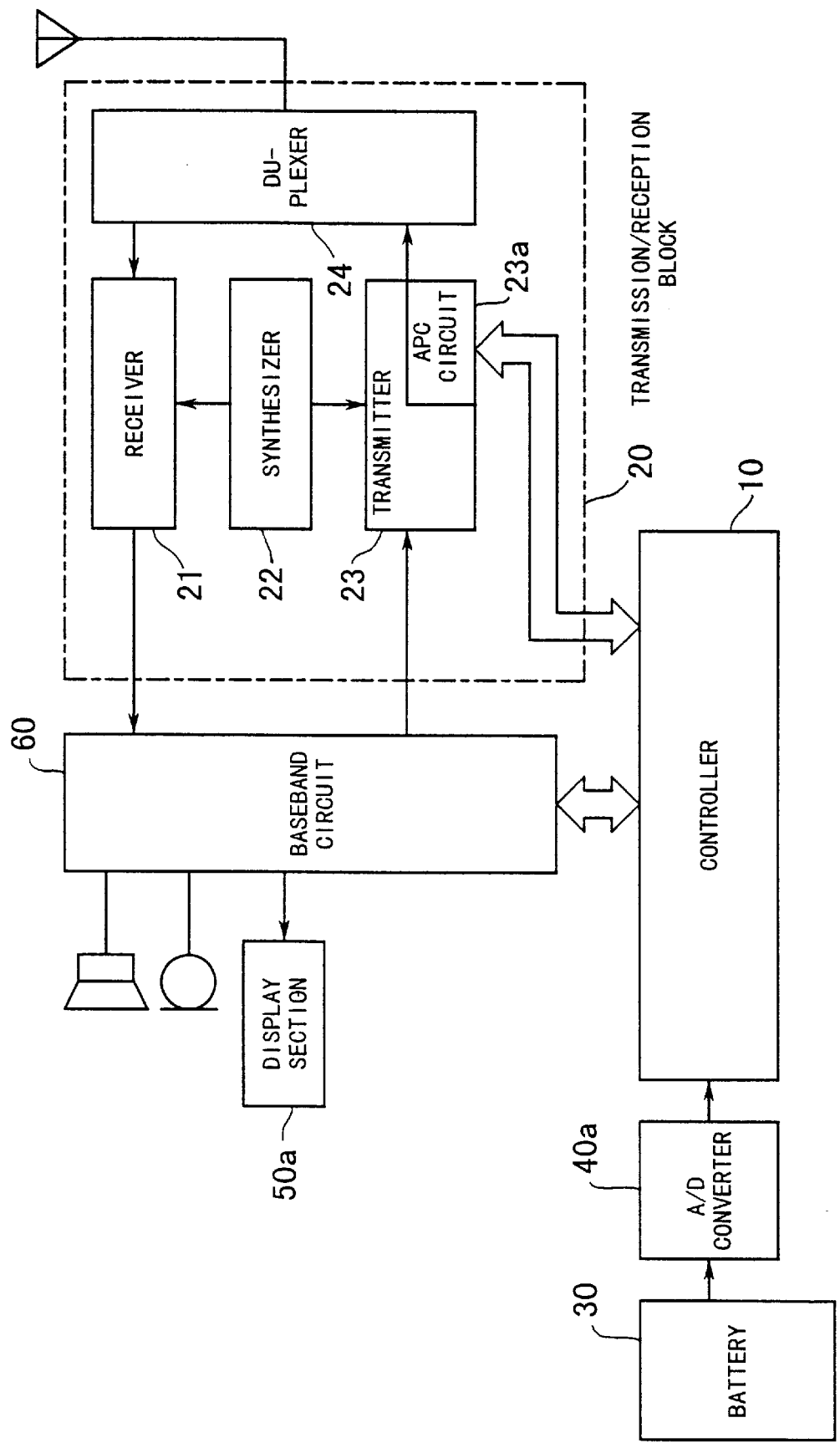
FIG. 2 is a block diagram showing the whole arrangement of a mobile terminal including a remaining battery capacity display device according to a first embodiment of the invention.

FIG. 2 shows the whole arrangement of a mobile terminal including a remaining battery capacity display device according to the first embodiment. This terminal communicates with a corresponding base station in a CDMA-based mobile communications network. In FIG. 2, an A/D (analog-to-digital) converter 40a corresponds to the voltage detection means 40 appearing in FIG. 1, and a display section 50a corresponds to the display device 50 in the same.

The A/D converter 40a measures an analog voltage value of the battery 30 and converts the measured analog value into a digital value to deliver the same to a controller 10. The controller 10 is implemented by a data processor comprised of a CPU (central processing unit), a ROM (read-only memory), a RAM (random access memory), and an input-output unit. The controller 10 calculates a remaining capacity of the battery 30 based on the voltage value of the battery 30 and a transmission output level of a transmission/reception block 20, and further calculates a communicatable time period to deliver the calculated communicatable time period to the display section 50a. Processing carried out by the controller 10 will be described in detail hereinbelow with reference to FIG. 3.

The transmission/reception block 20 is comprised of a receiver 21, a synthesizer 22, a transmitter 23, and a duplexer 24. The transmitter 23 includes an APC (Auto Power Control) circuit 23a. The APC circuit 23a sets a negative feedback amount for the transmitter 23 to thereby adjust the transmission output level of the transmitter 23 in response to a transmission output control signal delivered from the controller 10. The controller 10 receives an APC setting value sent from the corresponding base station via the receiver 21 and a baseband circuit 60, and generates the transmission output control signal based on the APC setting value. The APC setting value is periodically or sporadically set by the base station for each mobile terminal such that signals transmitted from the mobile terminal can be always received at a level high enough but as low as possible, and delivered from the base station to the mobile terminal.

Figure 3:
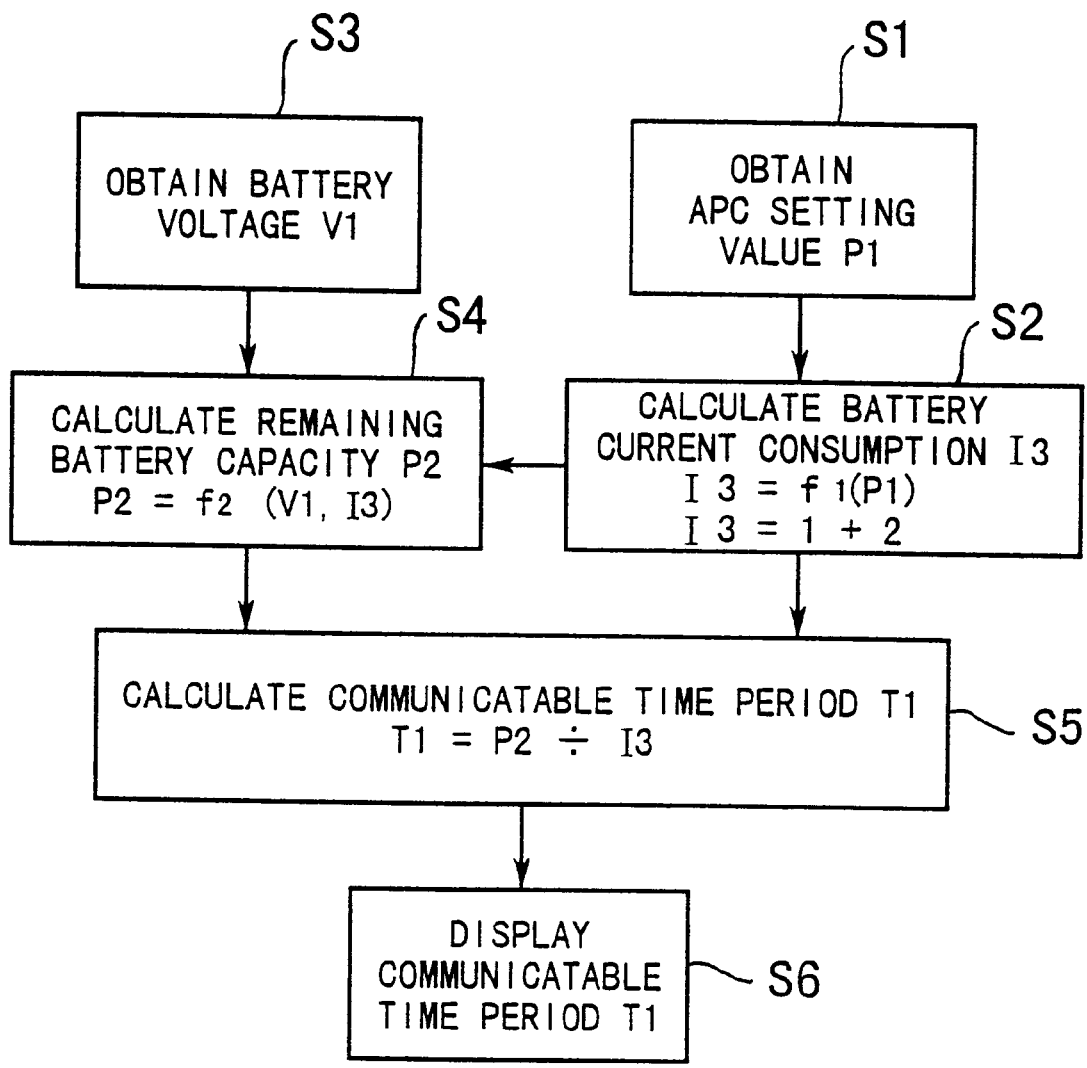
FIG. 3 is a flowchart showing a flow of processing by a controller.

FIG. 3 shows a flowchart showing a flow of processing carried out by the controller 10. The operations of the processing will be described below in the order of step numbers appearing in FIG. 3.

(Step S1) An APC setting value P1 is obtained from the baseband circuit 60 for conversion into a transmission output control signal, and then this control signal is delivered to the APC circuit 23a.

(Step S2) Further, a battery current consumption I3 is calculated by using the APC setting value P1. The process for calculating the battery current consumption I3 will be described below.

Figure 4:
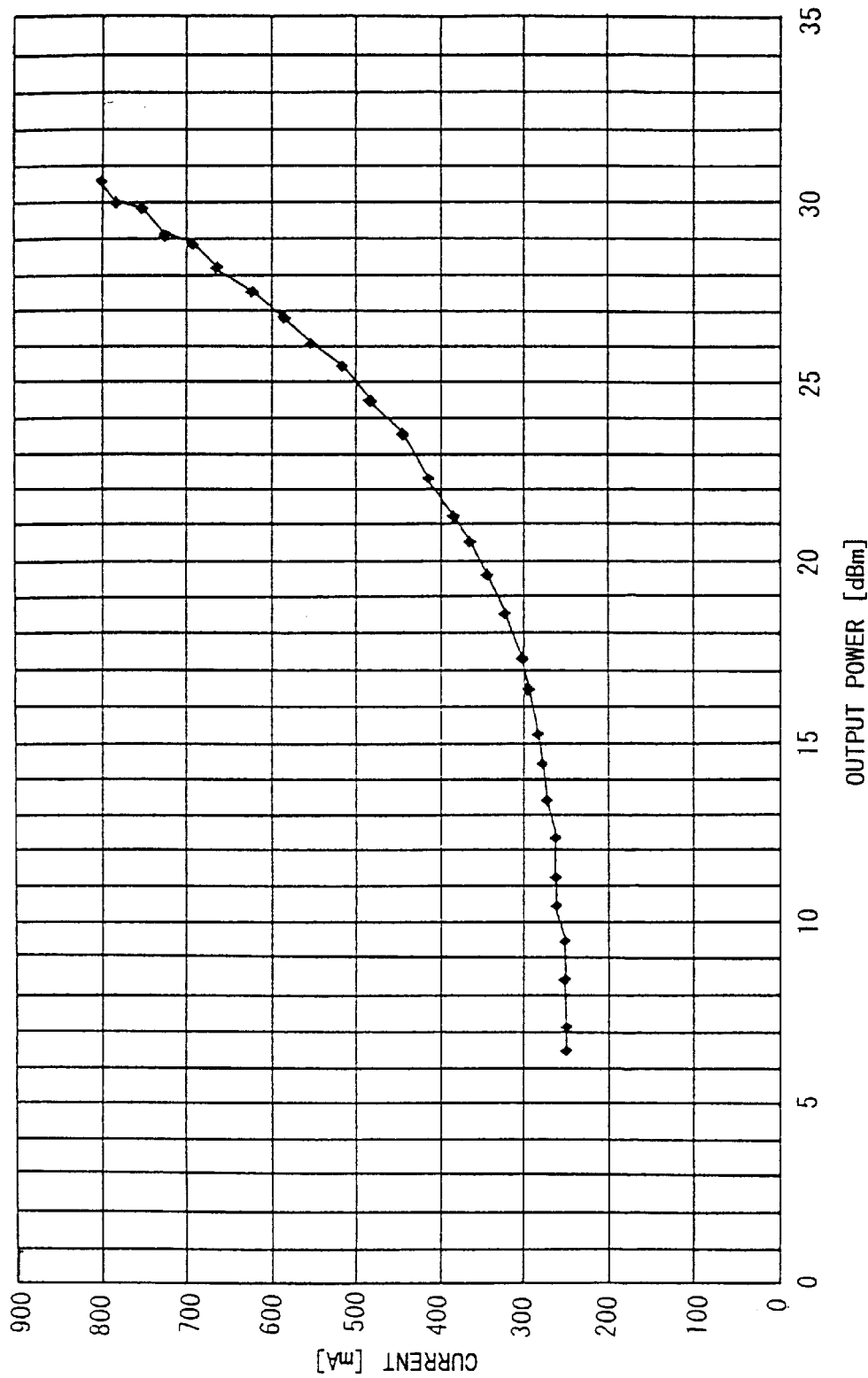
FIG. 4 is a graph showing an example of the relationship between the transmission output level and the current consumption by a transmitter.

FIG. 4 shows an example of measurement data of the battery current consumption by the transmission/reception block 23 in relation to the transmission output level of the block 23. A function $f_1$ that enables calculation of a current consumption I1 by the transmitter (hereinafter also referred to as "the transmitter current consumption I1") from the APC setting value P1 is prepared in advance based on such measurement data as shown in FIG. 4. The transmitter current consumption $I1=f_1$ (P1) is calculated by the use of the function $f_1$.

Next, a predetermined current I2 is added to the transmitter current consumption I1 to obtain the battery current consumption I3. The predetermined current I2 corresponds to a portion of the whole current consumed by the mobile terminal (battery current consumption), which is obtained by excluding the current consumption I1 by the transmitter 23 from the whole current consumption. The predetermined current I2 is substantially constant and assumes a small value in comparison with the transmitter current consumption I1.

(Step S3) A battery voltage V1 is obtained from the A/D converter 40a.

(Step S4) A remaining battery capacity P2 is calculated based on the battery voltage V1 and the battery current consumption I3. The process for calculating the battery voltage V1 will be described below.

Figure 11:
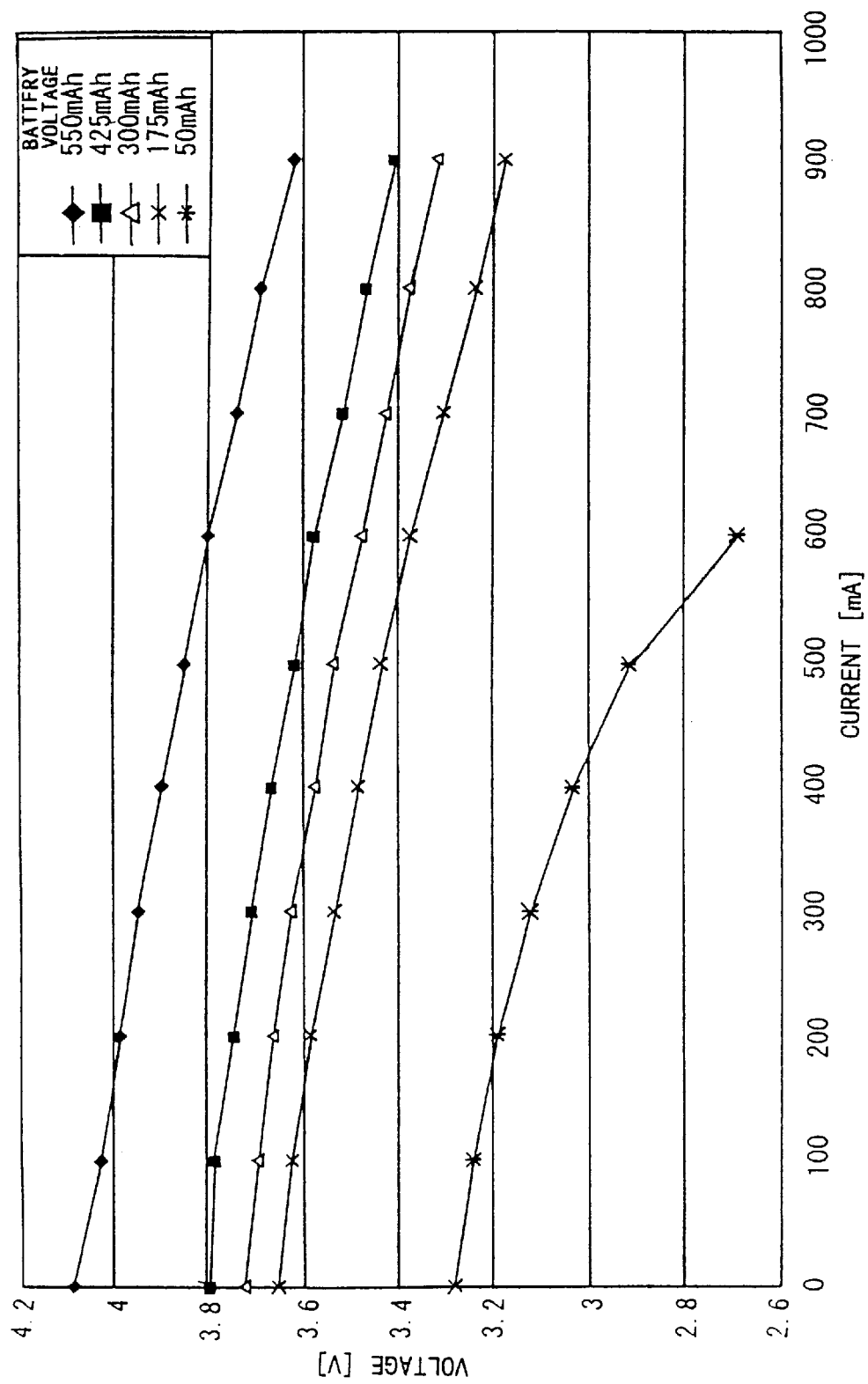
FIG. 11 is a graph showing an example of curves representative of current-voltage characteristics at respective levels of remaining capacity of a lithium battery.

FIG. 11 shows an example of measurement data of current-to-voltage measurements made at respective levels of the remaining battery capacity of a lithium battery. Assuming that the battery 30 has such characteristics, a cubic function $f_2$ that enables calculation of the remaining battery capacity P2 from the battery voltage 1 and the battery current consumption I3 is prepared in advance based on such measurement data as shown in FIG. 11. The remaining battery capacity $P2=f_2$ (V1, I3) is calculated by the use of the function $f_2$.

(Step S5) The remaining battery capacity P2 is divided by the battery current consumption I3 to obtain a communicatable time period T1.

(Step S6) The display section 50a is caused to display the communicatable time period T1.

Thus, even if transmission power is large and varies frequently, the remaining battery capacity P2 shows an exact value in a manner following up variation in the transmission power. Further, since the communicatable time period T1 is calculated based on the battery current consumption I3 corresponding to variation in the transmission power, the communicatable time period T1 can represent an exact remaining time period over which the mobile terminal can be used.

Although in the above first embodiment, the communicatable time period T1 is displayed by the display section 50a, this is not limitative, but the display section 50a may be caused to display the remaining battery capacity P2 instead.

Further, in the first embodiment, the mobile terminal carries out CDMA-based communication, in which transmission output level varies. The present invention can be most effectively applied to such a communication device that undergoes variation in the transmission output level. However, this is not limitative either, but the invention is generally applicable to any kind of device or apparatus powered by a battery.

Next, a second embodiment of the present invention will be described. The construction of the second embodiment is basically identical with that of the first embodiment. Therefore, detailed description of the construction will be omitted. The second embodiment is distinguished from the first embodiment only in the processing carried out by the controller 10.

Figure 5:
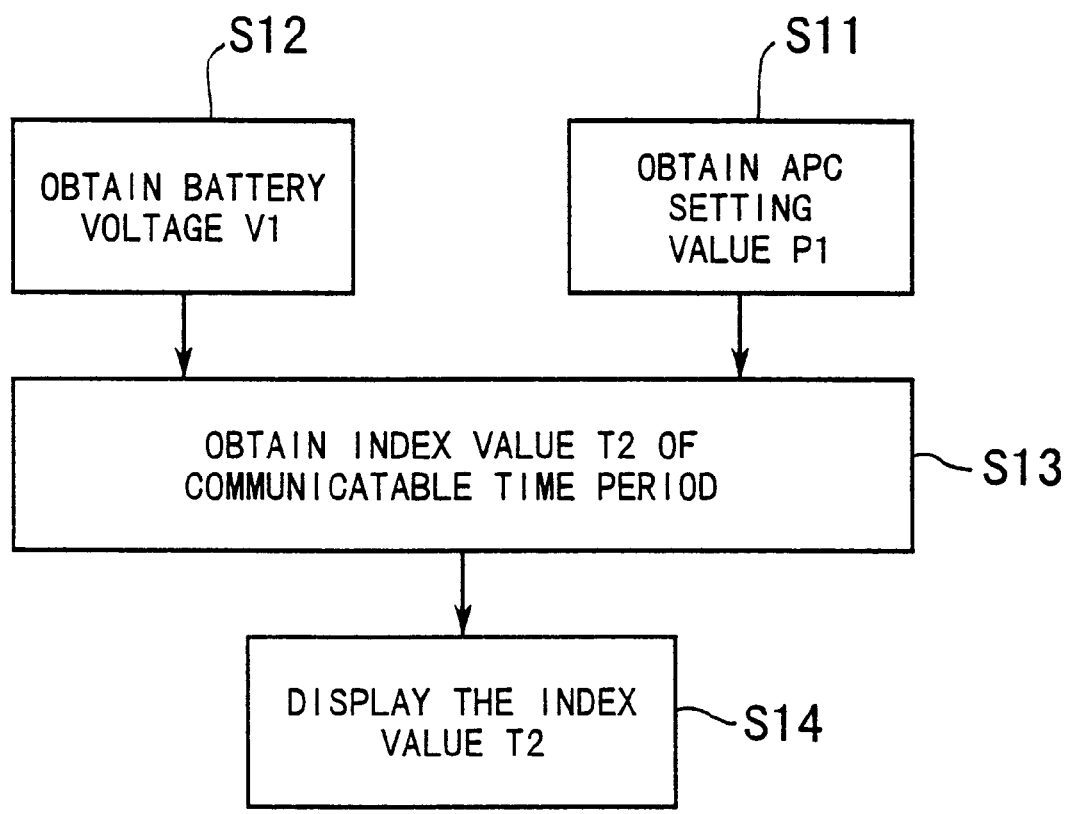
FIG. 5 is a flowchart showing a flow of processing by a controller of a remaining battery capacity display device according to a second embodiment of the invention.

FIG. 5 shows a flow of the processing carried out by the controller 10, according to the second embodiment. The operations of the processing will be described in the order of step numbers appearing in FIG. 5.

(Step S11) An APC setting value P1 is obtained from the baseband circuit 60 for conversion into a transmission output control signal, and this control signal is delivered to the APC circuit 23a. The APC setting value P1 is made available for an operation at the step S13 as well.

(Step S12) A battery voltage V1 is obtained from the A/D converter 40a.

(Step S13) An index value T2 indicative of a communicatable time period corresponding to the APC setting value P1 and the battery voltage V1 is obtained with reference to a predetermined table.

FIG. 6 shows the predetermined table. More specifically, battery current consumption values corresponding respectively to APC setting values $P_{TH1}$, $P_{TH2}$, and $P_{TH3}$ are determined based on the FIG. 4 measurement data. Further, remaining battery capacity levels corresponding respectively to the determined battery current consumption values and the battery voltage ranges (lower than $V_{TH1}$, equal to or higher than $V_{TH1}$ and at the same time lower than $V_{TH2}$, equal to or higher than $V_{TH2}$ and at the same time lower than $V_{TH3}$, equal to or higher than $V_{TH3}$ and at the same time lower than $V_{TH4}$, and equal to or higher than $V_{TH4}$) are calculated based on the FIG. 11 measurement data. Each of the remaining battery capacity levels is divided by a corresponding one of the battery current consumption values to obtain a corresponding communicatable time period. Then, it is determined to which of four time ranges of within one minute, one to ten minutes, ten to forty minutes, and over forty minutes, the obtained communicatable time period belongs. The time ranges are designated by numbers 0, 1, 2, 3, respectively, for use as the index value T2 indicative of the communicatable time period. These numbers are set to the table such that they are correlated to the APC setting values and the battery voltage ranges.

(Step S14) The display section 50a is caused to display the number representative of the index value T2 obtained from the predetermined table. An operator of the mobile terminal can recognize the communicatable time period from the number displayed on the display section 50a.

Although in the second embodiment described above, the index value T2 of the communicatable time period is obtained from the predetermined table, this is not limitative, but the communicatable time period itself or the remaining battery capacity may be obtained instead.

Next, a third embodiment of the present invention will be described. The construction of the third embodiment is basically identical with that of the first embodiment. Therefore, detailed description of the construction will be omitted. The third embodiment is distinguished from the first embodiment only in the processing carried out by the controller 10.

Figure 7:
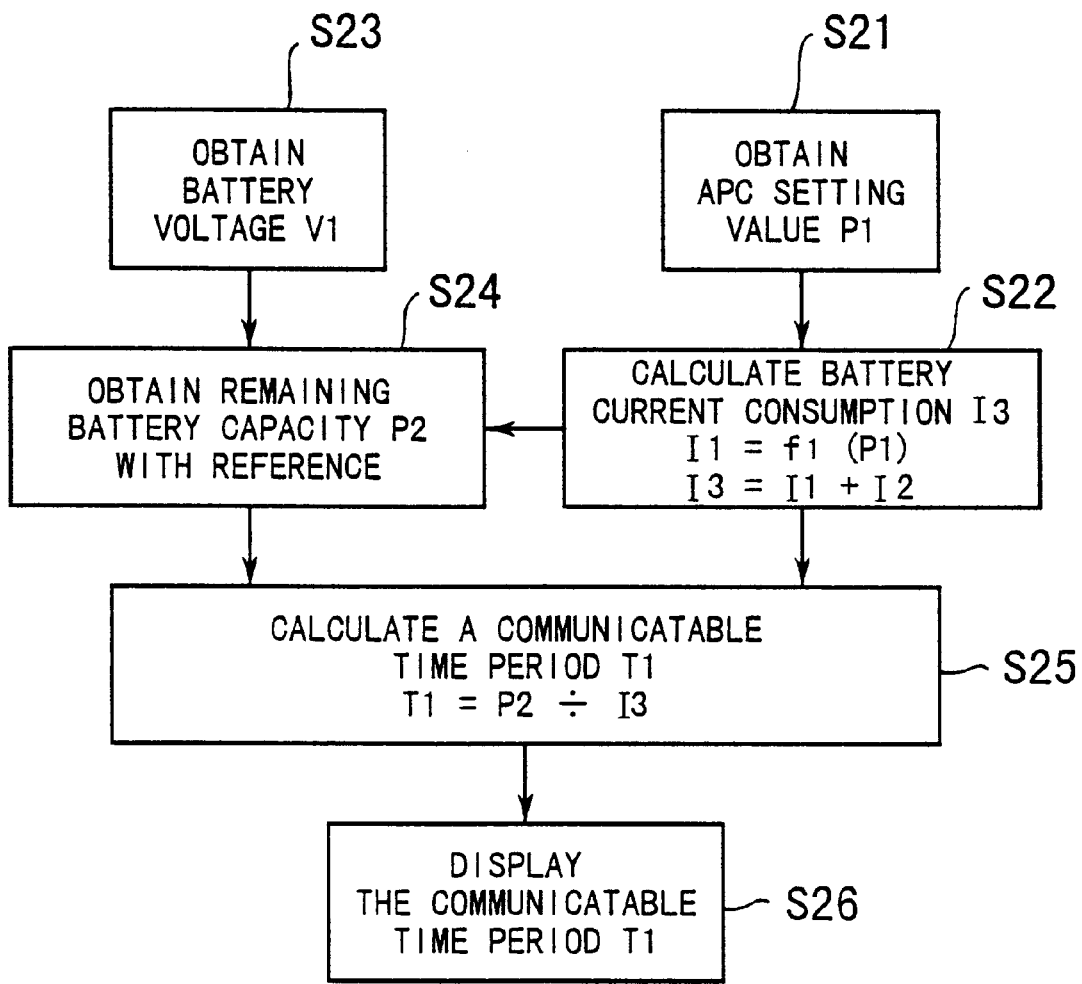
FIG. 7 is a flowchart showing a flow of processing by a controller of a remaining battery capacity display device according to a third embodiment of the invention.

FIG. 7 shows a flow of the processing carried out by the controller 10, according to the third embodiment. The operations of the processing will be described below in the order of step numbers appearing in the figure.

(Step S21) An APC setting value P1 is obtained from the baseband circuit 60 for conversion into a transmission output control signal and this control signal is delivered to the APC circuit 23a.

(Step S22) Further, a battery current consumption I3 is calculated by the use of the APC setting value P1. The calculation is carried out in the same process as described as to the step S2 of the first embodiment.

(Step S23) A battery voltage V1 is obtained from the A/D converter 40a.

(Step S24) Remaining battery capacity P2 corresponding to the battery voltage V1 and the battery current consumption I3 is obtained with reference to a predetermined table.

FIG. 8 shows the predetermined table. Assuming that the battery 30 has characteristics shown in FIG. 11, remaining battery capacity levels ($P2_1$ to $P2_{25}$) corresponding respectively to battery current consumption ranges (smaller than $I_{TH1}$, equal to or larger than $I_{TH1}$, and at the same time smaller than $I_{TH2}$, equal to or larger than $I_{TH2}$ and at the same time smaller than $I_{TH3}$, equal to or larger than $I_{TH3}$ and at the same time smaller than $I_{TH4}$, and larger than $I_{TH4}$) and the battery voltage ranges (lower than $V_{TH1}$, higher than or equal to $V_{TH1}$ and lower than $V_{TH2}$, higher than or equal to $V_{TH2}$ and lower than $V_{TH3}$, higher than or equal to $V_{TH3}$ and lower than $V_{TH4}$, and equal to or higher than $V_{TH4}$) are calculated based on the FIG. 11 measurement data. The remaining battery capacity levels are set to the table such that they are correlated to the battery current consumption ranges and the battery voltage ranges.

(Step S25) The obtained remaining battery capacity P2 is divided by the battery current consumption I3 to obtain a communicatable time period T1.

(Step S26) The display section 50a is caused to display the communicatable time period T1.

Although in the third embodiment described above as well, the communicatable time period T1 is displayed by the display section 50a, this is not limitative, but the remaining battery capacity P2 may be displayed instead.

Next, a fourth embodiment of the present invention will be described.

Figure 9:
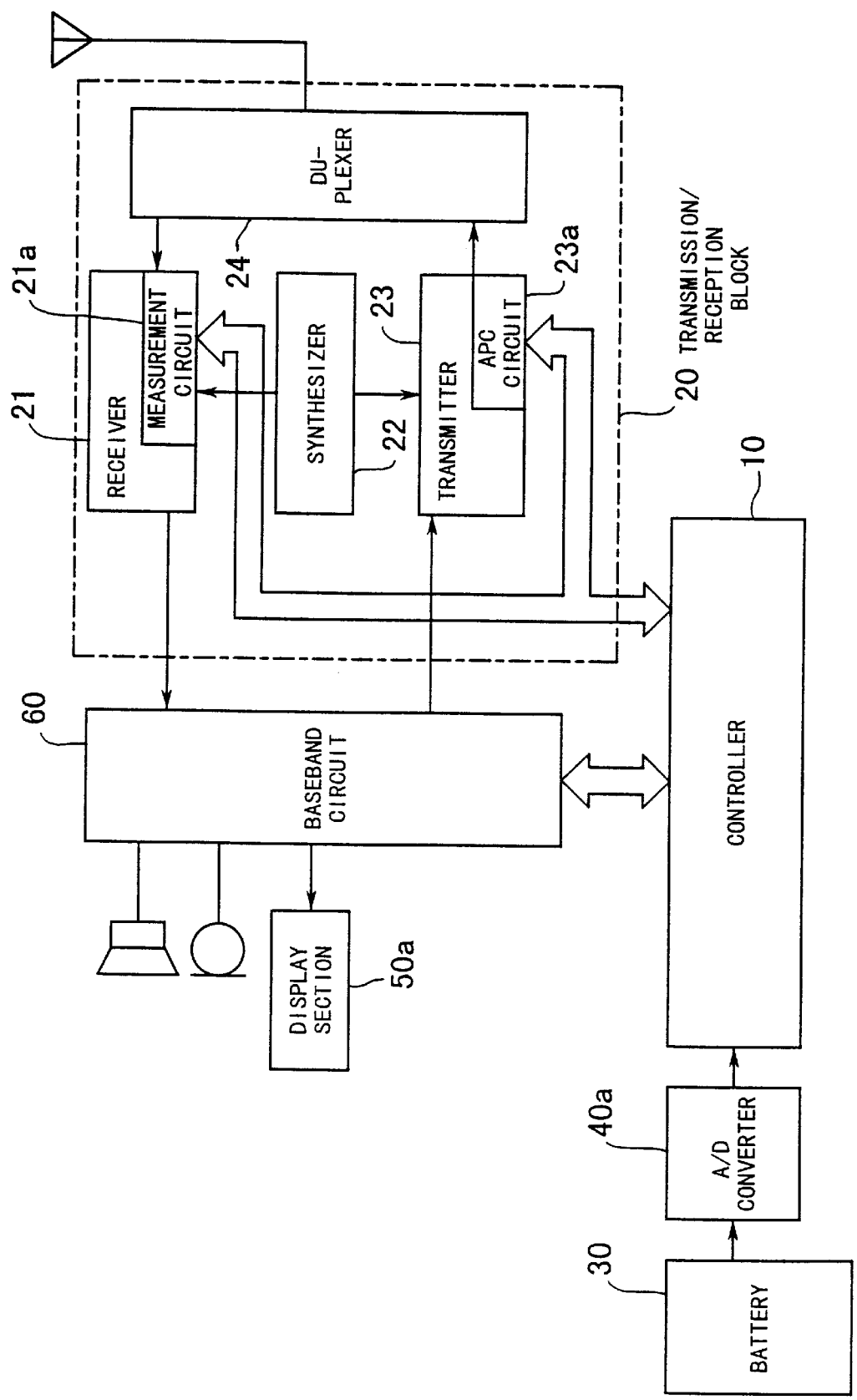
FIG. 9 is a block diagram showing the whole arrangement of a mobile terminal including a remaining battery capacity display device according to a fourth embodiment of the invention.

FIG. 9 shows the whole arrangement of a mobile terminal including a remaining battery capacity display device according to the fourth embodiment, which is basically identical with that of the first embodiment. Therefore, component parts and elements similar to those of the first embodiment are designated by identical reference numerals, and detailed description thereof is omitted.

In the fourth embodiment, a receiver 21 includes a measurement circuit 21a. The TIA (Telecommunications Industry Association) of the United States adopted a standard IS-95 concerning the CDMA. The standard IS-95 prescribes a technique (Open Loop Power Control) in which an APC setting value is not transmitted from a base station to a mobile terminal, but the mobile terminal measures a reception level of a signal sent from the base station and determines a transmission output level thereof according to the reception level. The remaining battery capacity display device according to the fourth embodiment is configured to operate according to this standard, and the measurement circuit 21a measures a reception level of a signal transmitted from an corresponding base station to deliver the measured reception level to a controller 10.

Figure 10:
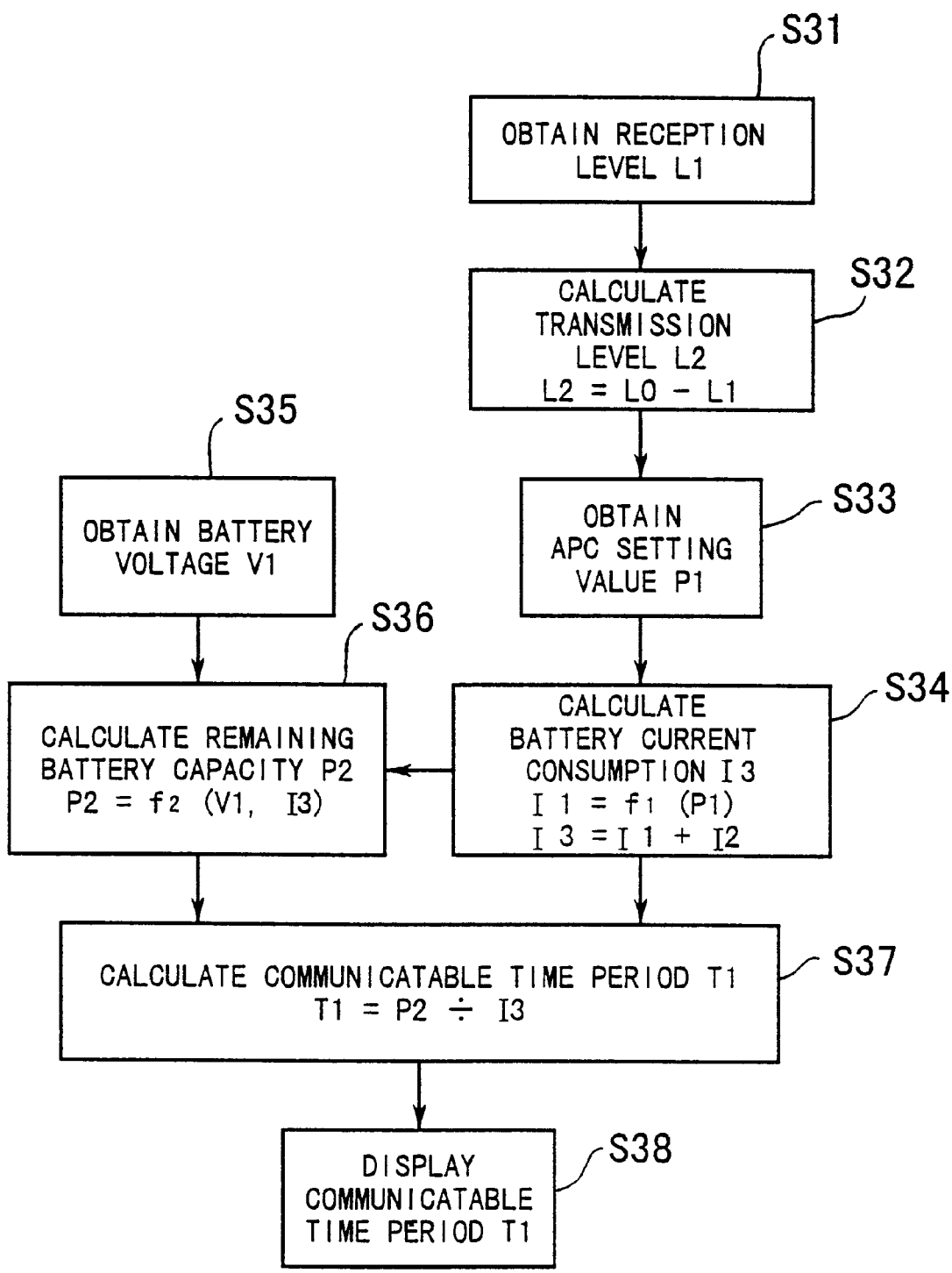
FIG. 10 is a flowchart showing a flow of processing by a controller according to the fourth embodiment.

FIG. 10 shows a flow of processing carried out by the controller 10, according to the fourth embodiment. The operations of the processing will be described below in the order of step numbers appearing in the figure.

(Step S31) A reception level LI is obtained from the measurement circuit 21a.

(Step S32) A transmission level L2 is calculated based on the reception level L1. More specifically, the transmission level L2 is obtained by subtracting the reception level L1 from a predetermined reference value L0. The standard IS-95 prescribes a value of −73 dBm as the predetermined reference value L0.

(Step S33) An APC setting value is obtained by the use of the calculated transmission level L2, for conversion into a transmission output control signal, and this control signal is delivered to an APC circuit 23a.

The operations executed at the steps S34 to S38 are identical with the operations executed at the steps S2–S6 of the first embodiment, so that description thereof is omitted.

The measurement circuit 21a and the operations executed at the steps S31 to S33 may be applied to the second or third embodiment.

As described above, according to the present invention, the current consumption calculation means calculates a battery current consumption from a transmission output level of the communication device, and the remaining battery capacity calculation means calculates a remaining battery capacity based on the calculated battery current consumption and a value of the battery voltage. Therefore, even if the transmission output level varies to cause variation in the battery current consumption, the remaining battery capacity can be calculated in a manner constantly following up the variation.

Thus, an exact remaining battery capacity can be displayed irrespective of the variation in the battery current consumption.

Further, it is possible to display not only the remaining battery capacity but also a communicatable time period calculated by the communicatable time period calculation means in a manner following up variation in the battery current consumption.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A remaining battery capacity display device for use in a communication device powered by a battery, comprising:

voltage detection means for detecting a value of voltage of said battery;

current consumption calculation means, coupled to said communication device, for calculating a battery current consumption based on a transmission output level of said communication device, received from said communication device, said current consumption calculation not being based on said value of voltage of said battery;

remaining battery capacity calculation means, coupled to said voltage detection means and to said current calculation means, for calculating a remaining battery capacity based on said value of said voltage of said battery detected by said voltage detection means and said battery current consumption calculated by said current consumption calculation means;

a display device; and display control means, coupled to said remaining battery capacity calculation means to receive therefrom calculated remaining battery capacity and to said display device for causing said display device to carry out display operation according to said remaining battery capacity calculated by said remaining battery capacity calculation means, wherein said display control means includes:

communicatable time period calculation means for calculating a communicatable time period over which said communication device is capable of communication, based on said remaining battery capacity calculated by said remaining battery capacity calculation means and said battery current consumption calculated by said current consumption calculation means, and communicatable time period display-instructing means for instructing said display device to display said communicatable time period calculated by said communicatable time period calculation means.

2. A remaining battery capacity display device according to claim 1, wherein said display control means includes remaining battery capacity display-instructing means for instructing said display device to display said remaining battery capacity calculated by said remaining battery capacity calculation means.

3. A remaining battery capacity display device according to claim 1, wherein said communication device is a mobile terminal used in a CDMA-based mobile communications network, said remaining battery capacity display device further including signal reception means for receiving from a base station of said CDMA-based mobile communications network information related to said transmission output level at which a signal is to be sent from said communication device to said base station and delivering said information to said current consumption calculation means.

4. A remaining battery capacity display device according to claim 1, wherein said communication device is a mobile terminal used in a CDMA-based mobile communications network, said remaining battery capacity display device further including:

measurement means for measuring a reception level at which is received a transmission signal sent from a base station of said CDMA-based mobile communications network, and transmission level calculation means for calculating said transmission output level based on said reception level measured by said measurement means, to deliver said calculated transmission output level to said current consumption calculation means.

5. A remaining battery capacity display device for use in a communication device powered by a battery, comprising:

a predetermined table that stores data of communicatable time periods over which said communication device is capable of communication, said communicatable time periods being correlated to values of voltage of said battery and transmission output levels of said communication device, respectively, said communicatable time periods being calculated based on respective battery current consumption values, said respective battery current consumption values being calculated based on transmission output levels of said communication device and not based on values of voltage of said battery;

voltage detection means for detecting a value of said voltage of said battery of said communication device;

reading means for reading out one of said communicatable time periods corresponding to said value of said battery voltage detected by said voltage detection means and one of said transmission output levels of said communication device, with reference to said predetermined table; and display means for displaying said one of said communicatable time periods read out by said reading means.

6. A remaining battery capacity display device for use in a communication device powered by a battery, comprising:

voltage detection means for detecting a value of voltage of said battery of said communication device;

current consumption calculation means, coupled to said communication device, for calculating a battery current consumption based on a transmission output level of said communication device, received from said communication device, said current consumption calculation not being based on said value of voltage of said battery;

a predetermined table that stores data of values of remaining battery capacity of said battery, said values of said remaining battery capacity being correlated to values of said voltage of said battery of said communication device, respectively;

reading means for reading out one of said values of said remaining battery capacity corresponding to said value of said battery voltage detected by said voltage detection means, with reference to said predetermined table;

a display device; and display control means, coupled to said reading means and to said display device, for causing said display device to carry out display operation based on said one of said values of said remaining battery capacity read out by said reading means, wherein said display control means includes:

a communicatable time period calculation means for calculating a communicatable time period over which said communication device is capable of communication, based on said one of said values of said remaining battery capacity read out by said reading means and said battery current consumption calculated by said current consumption calculation means, and a communicatable time period display-instructing means for instructing said display device to display said communicatable time period calculated by said communicatable time period calculation means.

* * * * *